(12) United States Patent
Chang et al.

(10) Patent No.: US 12,394,495 B2
(45) Date of Patent: Aug. 19, 2025

(54) ADAPTIVE INTEGRITY SCAN IN A MEMORY SUB-SYSTEM

(71) Applicant: Micron Technology, Inc., Boise, ID (US)

(72) Inventors: Li-Te Chang, San Jose, CA (US); Murong Lang, San Jose, CA (US); Zhenming Zhou, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 183 days.

(21) Appl. No.: 17/891,852

(22) Filed: Aug. 19, 2022

(65) Prior Publication Data

US 2024/0062834 A1 Feb. 22, 2024

(51) Int. Cl.
*G11C 16/30* (2006.01)
*G11C 16/04* (2006.01)
*G11C 16/26* (2006.01)
*G11C 16/34* (2006.01)

(52) U.S. Cl.
CPC .......... *G11C 16/34* (2013.01); *G11C 16/0483* (2013.01); *G11C 16/26* (2013.01)

(58) Field of Classification Search
CPC ....... G11C 29/028; G11C 16/34; G11C 16/26; G11C 16/0483; G11C 29/023; G11C 2029/0409; G11C 29/42; G11C 2029/0411; G11C 16/3422
See application file for complete search history.

(56) References Cited

U.S. PATENT DOCUMENTS

2016/0314847 A1* 10/2016 Yang .................... G06F 11/1072
2021/0263821 A1* 8/2021 Yang .................... G11C 29/021

\* cited by examiner

*Primary Examiner* — Uyen Smet
(74) *Attorney, Agent, or Firm* — Lowenstein Sandler LLP

(57) ABSTRACT

A processing device in a memory sub-system detects an occurrence of a data integrity check trigger event in the memory sub-system, and in response, identifies a memory die of a plurality of memory dies in the memory sub-system. The processing device further determines a read margin associated with a first distribution of memory cells of the identified memory die, and determines an adaptive scan frequency for the identified memory die based on the read margin associated with the first distribution of memory cells.

17 Claims, 5 Drawing Sheets

ADAPTIVE INTEGRITY SCAN IN A MEMORY SUB-SYSTEM

TECHNICAL FIELD

Embodiments of the disclosure relate generally to memory sub-systems, and more specifically, relate to an adaptive integrity scan in a memory sub-system using lower page calibration.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
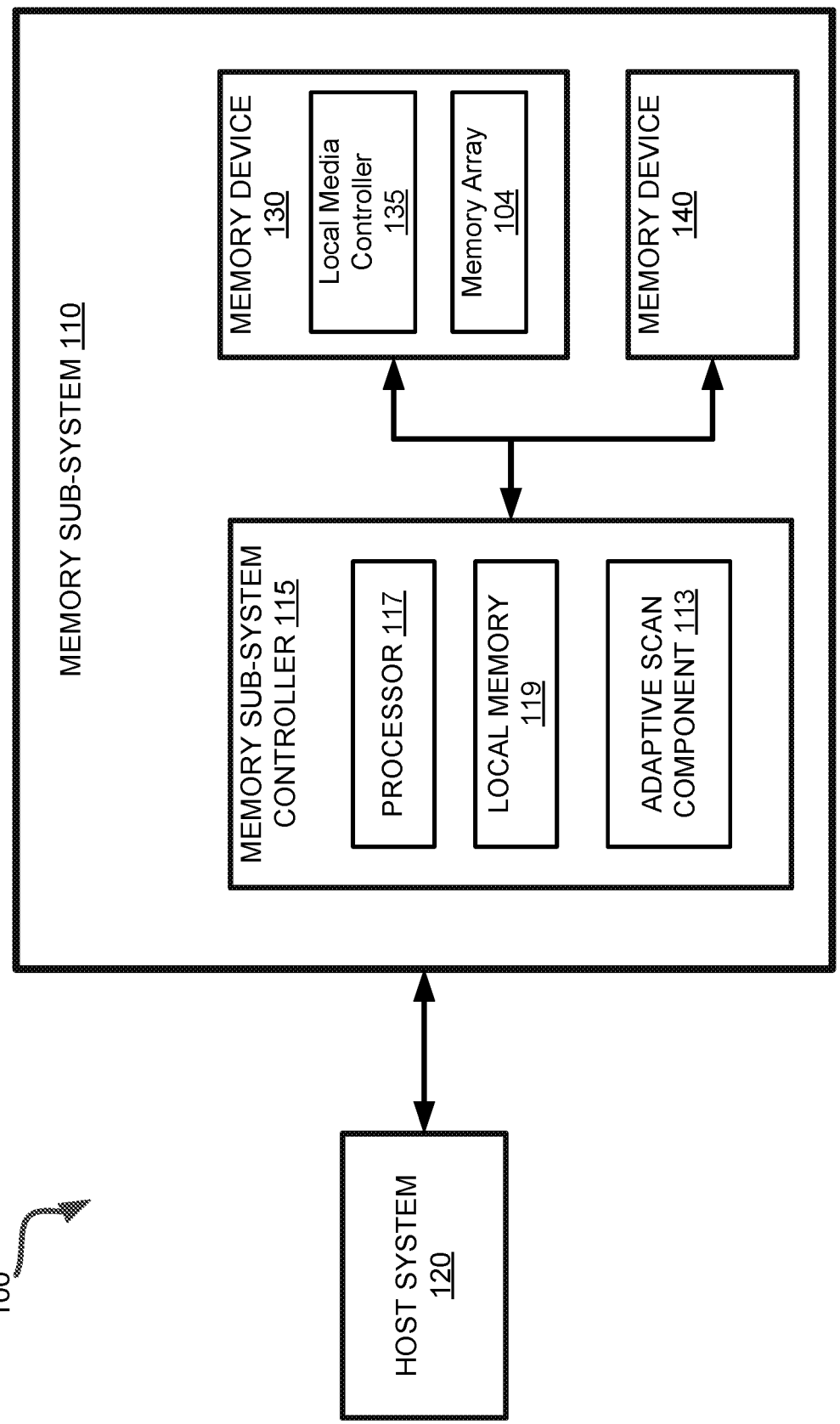
FIG. 1 illustrates an example computing system that includes a memory sub-system in accordance with some embodiments of the present disclosure.

Aspects of the present disclosure are directed to an adaptive integrity scan in a memory sub-system using lower page calibration. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

One example of a memory sub-system is a solid-state drive (SSD) that includes one or more non-volatile memory devices and a memory sub-system controller to manage the non-volatile memory devices. A given segment of one of those memory devices (e.g., a block) can be characterized based on the programming state of the memory cells associated with wordlines contained within the segment. When data is written to a memory cell of the segment for storage, the memory cell can deteriorate. Accordingly, each memory cell of the segment can handle a finite number of write operations performed before the memory cell is no longer able to reliably store data. Data stored at the memory cells of the segment can be read from the memory device and transmitted to a host system. When data is read from a memory cell, nearby or adjacent memory cells can experience what is known as read disturb. Read disturb is the result of continually reading from one memory cell without intervening erase operations, causing other nearby memory cells to change over time (e.g., become programmed). If too many read operations are performed on a memory cell, data stored at adjacent memory cells of the segment can become corrupted or incorrectly stored at the memory cell. This can result in a higher error rate of the data stored at the memory device. This can increase the use of an error detection and correction operation (e.g., an error control operation) for subsequent operations (e.g., read and/or write operations) performed on the memory device. The increased use of the error control operation can result in a reduction of the performance of a conventional memory sub-system. In addition, as the error rate for a memory cell or data block continues to increase, it may even surpass the error correction capabilities of the memory sub-system, leading to an irreparable loss of the data. Furthermore, as more resources of the memory sub-system are used to perform the error control operation, fewer resources can be used to perform other read operations or write operations.

The error rate associated with data stored at the data block can increase due to a number of factors, including read disturb, slow charge loss, etc. Therefore, at certain intervals (e.g., upon a threshold number of read operations being performed on the block or upon the passage of a certain period of time), the memory sub-system can perform a data integrity check (also referred to herein as a "scan") to verify that the data stored at the block does not include any errors. During the data integrity check, one or more reliability statistics are determined for data stored at the block. One example of a reliability statistic is raw bit error rate (RBER).

The RBER corresponds to a number of bit errors per unit of time that the data stored at the block experiences.

If the data integrity check indicates that the reliability statistic for a block exceeds a threshold value, indicating a high error rate associated with data stored at the block, then the data stored at the block can be relocated to a new block of the memory sub-system (also referred to herein as "folding"). The folding of the data stored at the block to the other block can include writing the data to the other block to refresh the data stored by the memory sub-system. This can be done to negate the effects of read disturb associated with the data and to erase the data at the block. Many memory sub-systems have a set scan frequency at which the data integrity check is performed for each block or other segment of the memory device. For example, this scan frequency might be set at approximately one half of a latent read disturb (LRD) threshold. The LRD threshold represents an approximate amount of time it will take a block of the memory device to degrade to a point of non-recoverability. This scan frequency is typically the same for all blocks in the memory device and is fixed for the entire lifetime of the memory sub-system. Accordingly, they are designed for end-of-life conditions of extreme memory die in an effort to limit data loss under those circumstances. The fixed scan frequency, however, is often too conservative for memory devices with lower program-erase cycle (PEC) counts, thereby resulting in overscanning, and does not account for die-to-die variations in the memory sub-system. Performing such data integrity checks too frequently (i.e., more often than necessary) can hurt system performance, as well as an increase the power consumption of the memory sub-system. System bandwidth and other resources are also tied up for extended periods of time, preventing the use of those resources for other functionality.

Aspects of the present disclosure address the above and other deficiencies by performing an adaptive integrity scan in the memory sub-system using lower page calibration. In one embodiment, the memory sub-system controller can adaptively adjust the scan frequency at which a data integrity check is performed from different memory devices (e.g., memory dies) in the memory sub-system. For example, in response to a triggering event, the memory sub-system controller can determine the read margin for a certain distribution (e.g., the L0 erase distribution) of a given memory die and adjust the scan frequency for that memory die based on the determined read margin. In general, when the read margin is smaller, the scan frequency can be decreased such that a data integrity check is performed more often for that memory die. Conversely, when the read margin is larger, the scan frequency can be increased such that the data integrity check is performed less often for that memory die. In one embodiment, the memory sub-system controller uses a lookup table, or other data structure, that includes predefined scan frequency values associated with different read margins. The memory sub-system controller than can thus perform a subsequent data integrity check for that memory die according to the adaptively determined scan frequency value. The same process can be performed separately for each memory die, or group of memory dies, in the memory sub-system.

Advantages of the approach described herein includes, but is not limited to, improved performance in the memory sub-system. For example, the data integrity checks help to avoid data corruption and the need for error correction operations, but adaptively determining the scan frequency ensures that overscanning is not performed, thereby saving system resources. In addition, by determining a separate scan frequency for each memory die, the memory sub-system controller can account for die-to-die variations and improve reliability over the entire lifetime of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DEVIM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some embodiments, the memory device(s) 130 include local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some embodiments, a memory device 130 is a managed memory device, which is a raw memory device (e.g., memory array 104) having control logic (e.g., local controller 135) for media management within the same memory device package. An example of a managed memory device is a managed NAND (MNAND) device. Memory device(s) 130, for example, can each represent a single die having some control logic (e.g., local media controller 135) embodied thereon. In some embodiments, one or more components of memory sub-system 110 can be omitted.

In one embodiment, the memory sub-system 110 includes an adaptive scan component 113 that can determine adaptive scan frequencies for respective memory dies (e.g., memory device 130) in memory sub-system 110 based on read margins of certain distributions of memory cells (e.g., erase distributions) of the memory dies. In one embodiment, adaptive scan component 113 detects an occurrence of a data integrity check trigger event in the memory sub-system 110, and in response, identifies a memory die of a plurality of memory dies in the memory sub-system 110. The data integrity check trigger event can include at least one of a power-on of the memory sub-system 110, an expiration of a threshold period of time since a previous data integrity check, or an occurrence of a threshold number of program-erase cycles in the memory sub-system 110 since the previous data integrity check. Adaptive scan component 113 can further determine a read margin associated with a first distribution of memory cells of the identified memory die (e.g., an erase distribution representing a plurality of memory cells of the identified memory die in an erased state), and determine an adaptive scan frequency for the identified memory die based on the read margin associated with the first distribution of memory cells. When the adaptive scan frequency has been reached, adaptive scan component 113 can perform a data integrity check to determine a reliability statistic (e.g., RBER) for a segment (e.g., a block) of the identified memory die, and determine whether the reliability statistic satisfies a folding criterion (e.g., is greater than a threshold value). Responsive to determining that the reliability statistic satisfies the folding criterion, adaptive scan component 113 can perform a folding operation on the segment of the identified memory die. Further details with regards to the operations of adaptive scan component 113 are described below.

Figure 2:
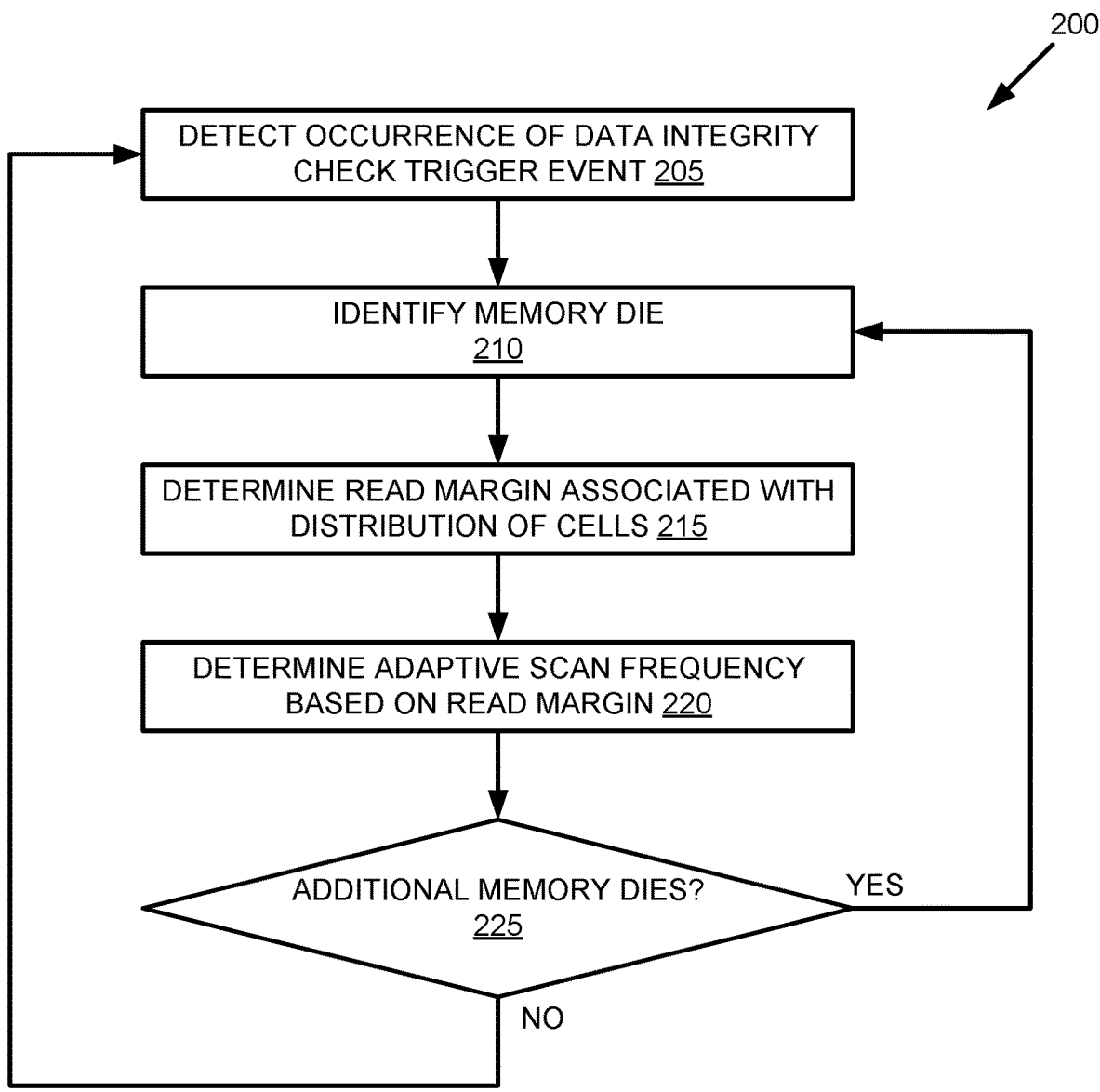
FIG. 2 is a flow diagram of an example method of determining adaptive scan frequencies for memory dies in a memory sub-system in accordance with some embodiments of the present disclosure.

FIG. 2 is a flow diagram of an example method of determining adaptive scan frequencies for memory dies in a memory sub-system in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by adaptive scan component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing logic (e.g., adaptive scan component 113) detects an occurrence of a data integrity check trigger event. Depending on the embodiment, the data integrity check trigger event comprises at least one of a power-on of the memory sub-system 110, an expiration of a threshold period of time since a previous data integrity check, or an occurrence of a threshold number of program-erase cycles in the memory sub-system since the previous data integrity check. For example, the initial power-on of the memory sub-system 110 can be a data integrity check trigger event, and subsequent data integrity check trigger events can occur at periodic intervals determined according to an adaptive scan frequency, as described in more detail below.

At operation 210, responsive to the occurrence of the data integrity check trigger event, the processing logic identifies a memory die of a plurality of memory dies. In one embodiment, memory sub-system 110 includes a plurality of memory dies. For example, memory device 130 can be representative of one memory die. A given memory die can be identified using any number of different approaches. For example, adaptive scan component 113 can identify the first die in a sequence (e.g., arranged by die number), or can identify the memory die randomly or pseudo-randomly.

At operation 215, the processing logic determines a read margin associated with a first distribution of memory cells of the identified memory die. The read margin represents a voltage range between the first distribution of memory cells (i.e., a group of memory cells in the same state) and an adjacent distribution of memory cells on the identified memory die. In one embodiment, the first distribution of memory cells of the identified memory die comprises an erase distribution representing a plurality of memory cells of the identified memory die in an erased state (e.g., L0 state). In one embodiment, the read margin is associated with a reliability statistic (e.g., RBER), which in turn is related to the error correction capability of the memory sub-system. Additional details pertaining to how the read margin is determined are described below with respect to FIG. 3.

Referring again to FIG. 2, at operation 220, the processing logic determines an adaptive scan frequency for the identified memory die based on the read margin associated with the first distribution of memory cells. In one embodiment, adaptive scan component 113 reads an entry of a plurality of entries in a data structure, wherein the entry is associated with the read margin and comprises an indication of the adaptive scan frequency. For example, adaptive scan component 113 could maintain a lookup table (LUT) or other data structure in local memory 119 of memory sub-system controller 115, or elsewhere in memory sub-system 110, that includes the plurality of entries. Each entry can be associated with a specific read margin or a range of read margins, and can include corresponding respective adaptive scan frequencies. The adaptive scan frequencies can be defined using a period of time since a previous scan, a number of PECs since a previous scan, or some other metric. In one embodiment, the respective adaptive scan frequencies for each read margin or range of read margins are determined via experimentation performed before or during manufacture of the memory sub-system 110 and are designed to account for the latent read disturb (LRD) threshold of a memory die exhibiting the different read margins for the erase distribution of memory cells. The LRD threshold represents an approximate amount of time it will take a block or other segment of the memory device to degrade to a point of non-recoverability. In one embodiment, there can be different data structures, or the values in the entries of one data structure can vary, to account for different points in the lifetime of the memory sub-system 110. For example, there could be one data structure having certain adaptive scan frequencies for the memory dies when the total program-erase cycle (PEC) count in the memory sub-system 110 is below a certain threshold, and another data structure having different adaptive scan frequencies for the memory dies when the total program-erase cycle (PEC) count in the memory sub-system 110 is above the threshold.

At operation 225, the processing logic determines whether there are additional memory dies among the plurality of memory dies. If so, the processing logic returns to operation 210 to identify a subsequent memory die and repeats operations 215 and 220 for each remaining die in order to determine respective adaptive scan frequencies for the each of the plurality of memory dies. If not, the processing logic returns to operation 205 and waits for a subsequent occurrence of a data integrity check trigger event.

Figure 3:
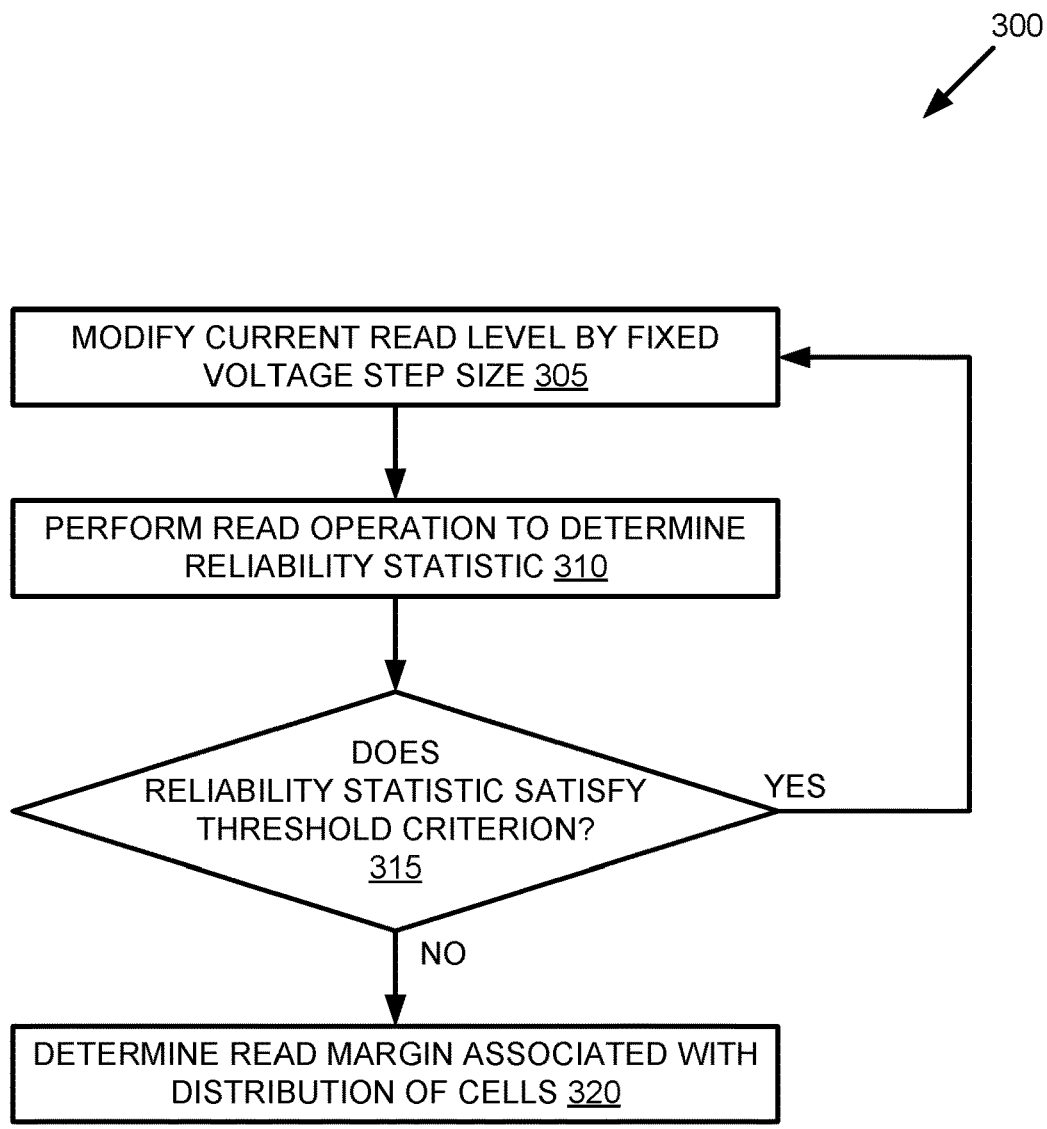
FIG. 3 is a flow diagram of an example method of determining a read margin associated with a distribution of memory cells on a memory die in accordance with some embodiments of the present disclosure.

FIG. 3 is a flow diagram of an example method of determining a read margin associated with a distribution of memory cells on a memory die in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by adaptive scan component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing logic (e.g., adaptive scan component 113) modifies a current read level by a fixed voltage step size. In one embodiment, adaptive scan component 113 is programed with a default read voltage level. That default read voltage level can be chosen to be located approximately between adjacent programming distributions of memory cells on the memory die. In one embodiment, adaptive scan component 113 can modify the current read level (e.g., the default read voltage level) by the fixed voltage step size. The magnitude of the fixed voltage step size can be configurable, and for example, adaptive scan component 113 might decrease the default read voltage level by 25 millivolts (mV) or 50 mV. This decreased read voltage level can be referred to as the modified read level.

At operation 310, the processing logic performs a read operation using the modified read level to determine an associated reliability statistic. In one embodiment, adaptive scan component 113 applies the modified read level to one or more wordlines of the identified memory die to read a raw code word (i.e., a series of a fixed number of bits) from the memory die. Adaptive scan component 113 can apply the code word to an error correcting code (ECC) decoder to generate a decoded code word and compare the decoded code word to the raw code word. Adaptive scan component 113 can count a number of flipped bits between the decoded code word and the raw code word, with a ratio of the number of flipped bits to the total number of bits in the code word representing the reliability statistic (e.g., the raw bit error rate (RBER)). Scan determining component 113 can repeat this process for additional code words until the entire memory die has been scanned.

At operation 315, the processing logic determines whether the associated reliability statistic satisfies a threshold criterion (e.g., remains below an error threshold). In one embodiment, adaptive scan component 113 compares the reliability statistic to the error threshold which represents an error correction capability of the memory die. Responsive to determining that the associated reliability statistic does not satisfy the threshold criterion (e.g., meets or exceeds the error threshold), at operation 320, the processing logic determines the read margin associated with the first distribution of memory cells based on the modified read level. For example, the read margin can be determined as the product of the number of voltage steps and the fixed voltage step size. In one embodiment, adaptive scan component 113 tracks the number of voltage steps (e.g., using a counter that is incremented each time operation 305 is performed). In another embodiment, adaptive scan component 113 determines the read margin as the difference between the modified read voltage and the default read voltage. Responsive to determining that the associated reliability statistic does satisfy the threshold criterion (e.g., remains below the error threshold), the processing logic returns to operation 305 and further modifies the modified read level by the fixed voltage step size. Adaptive scan component can repeat operations 305-315 for any number of voltage steps until the threshold criterion is no longer satisfied.

Figure 4:
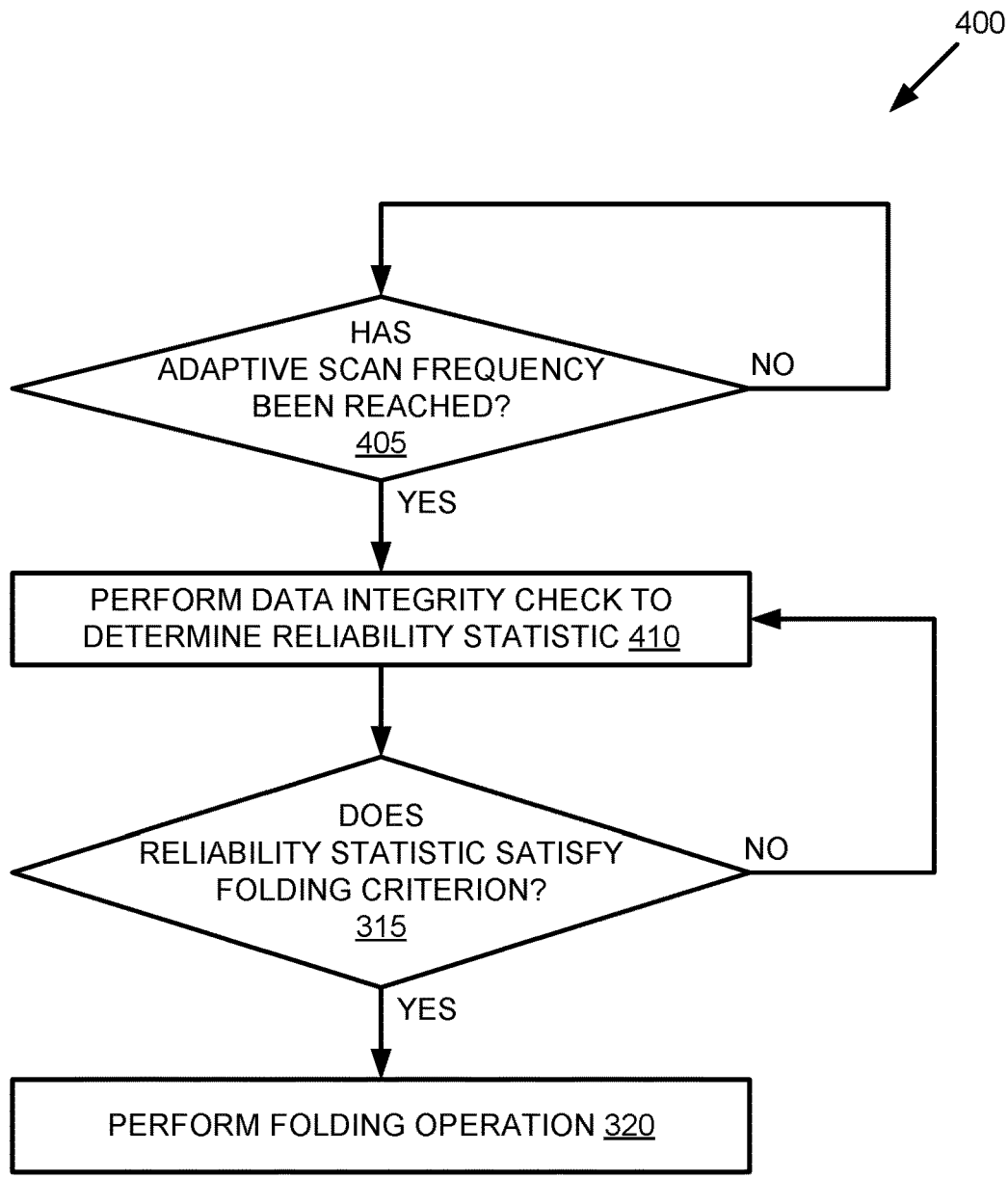
FIG. 4 is a flow diagram of an example method of performing a data integrity check on a memory die according to an adaptive scan frequency in accordance with some embodiments of the present disclosure.

FIG. 4 is a flow diagram of an example method of performing a data integrity check on a memory die according to an adaptive scan frequency in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by adaptive scan component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing logic (e.g., adaptive scan component 113) determines whether the adaptive scan frequency for the identified memory die has been reached. As determined in operation 220 of FIG. 2, each memory die can have a separate respective adaptive scan frequency based on the specific read margin of that memory die. For example, if the adaptive scan frequency is defined as a certain period of time since a previous data integrity check (i.e., scan), adaptive scan component 113 can maintain a timer set to an initial value according to the adaptive scan frequency. When the timer expires, adaptive scan component 113 can determine that the adaptive scan frequency has been reached. If the adaptive scan frequency is defined as a number of PECs since a previous data integrity check, adaptive scan component 113 can maintain a counter that is incremented each time a PEC occurs on the memory die. When the counter reaches a configurable threshold value, adaptive scan component 113 can determine that the adaptive scan frequency has been reached.

In response to determining that the adaptive scan frequency for the identified memory die has been reached, at operation 410, the processing logic performs a data integrity check to determine a reliability statistic for a segment of the identified memory die. In one embodiment, adaptive scan component 113 applies the default read voltage level to one or more wordlines of the identified memory die to read a raw code word (i.e., a series of a fixed number of bits) from the segment (e.g., a block) of the memory die. Adaptive scan component 113 can apply the code word to an error correcting code (ECC) decoder to generate a decoded code word and compare the decoded code word to the raw code word. Adaptive scan component 113 can count a number of flipped bits between the decoded code word and the raw code word, with a ratio of the number of flipped bits to the total number of bits in the code word representing the reliability statistic (e.g., the raw bit error rate (RBER)). Scan determining component 113 can repeat this process for additional code words until the entire memory die has been scanned.

At operation 415, the process logic determines whether the reliability statistic satisfies a folding criterion (e.g., meets or exceeds a folding threshold). In one embodiment, adaptive scan component 113 compares the reliability statistic to the folding threshold. Responsive to determining that the reliability statistic satisfies the folding criterion, at operation 420, the processing logic performs a folding operation on the segment of the identified memory die. In one embodiment, adaptive scan component 113 relocates data stored at segment to another segment on the same or a different memory die. In one embodiment, adaptive scan component 113 reads data stored in the corresponding block (i.e., the block for which the error rate meets or exceeds the folding threshold) writes that data to another block. Once the data has been written to the other block, the data stored in the initial block is erased and the initial block is available to be programmed with new data. Depending on the embodiment, the data is relocated to another block of the same plane of the same memory die, to another plane on the same memory die, or to a different memory die of the memory sub-system 110.

Figure 5:
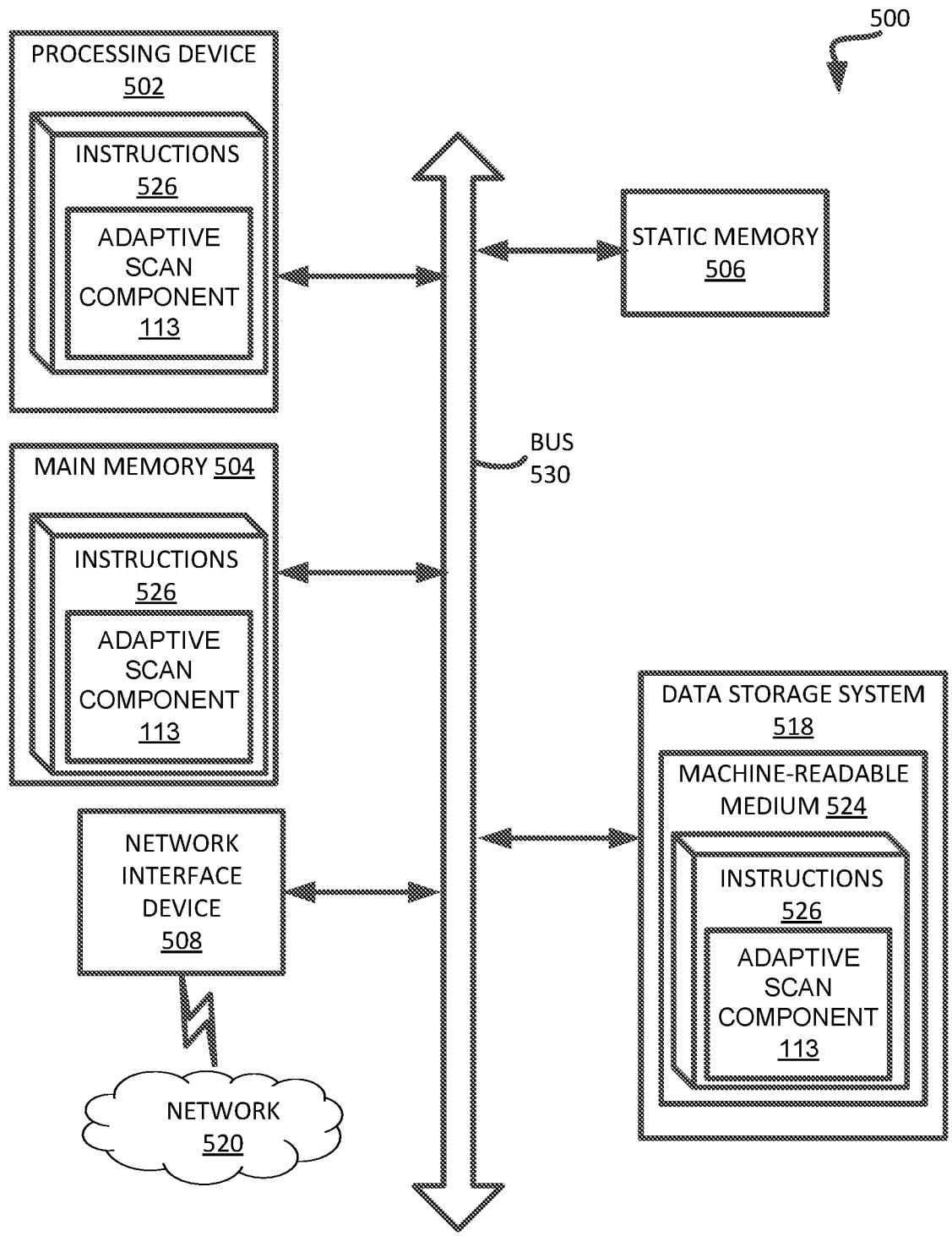
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the adaptive scan component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to the adaptive scan component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a plurality of memory dies;
   a processing device, operatively coupled with the plurality of memory dies, to perform operations comprising:
   detecting an occurrence of a data integrity check trigger event;
   responsive to the occurrence of the data integrity check trigger event, identifying a memory die of the plurality of memory dies;
   determining a read margin associated with a first distribution of memory cells of the identified memory die, wherein the read margin represents an entire voltage range between the first distribution of memory cells and an adjacent distribution of memory cells for which an associated reliability statistic satisfies a threshold criterion; and
   determining an adaptive scan frequency for the identified memory die based on the read margin associated with the first distribution of memory cells, wherein determining the adaptive scan frequency for the identified memory die based on the read margin associated with the first distribution of memory cells comprises reading an entry of a plurality of entries in a data structure, the entry corresponding to the read margin associated with the first distribution of memory cells, wherein each entry of the plurality of entries is associated with a respective read margin, and wherein each entry comprises an indication of a respective scan frequency corresponding to the respective read margin.

2. The system of claim 1, wherein the processing device is to perform operations further comprising:
   determining respective adaptive scan frequencies for each of the plurality of memory dies.

3. The system of claim 1, wherein the processing device is to perform operations further comprising:
   determining that the adaptive scan frequency for the identified memory die has been reached;
   performing a data integrity check to determine a reliability statistic for a segment of the identified memory die;
   determining whether the reliability statistic satisfies a folding criterion; and
   responsive to determining that the reliability statistic satisfies the folding criterion, performing a folding operation on the segment of the identified memory die.

4. The system of claim 1, wherein the data integrity check trigger event comprises at least one of a power-on of the system, an expiration of a threshold period of time since a previous data integrity check, or an occurrence of a threshold number of program-erase cycles in the system since the previous data integrity check.

5. The system of claim 1, wherein determining the read margin associated with the first distribution of memory cells of the identified memory die comprises:
   modifying a current read level by a fixed voltage step size;
   performing a read operation using the modified read level to determine the associated reliability statistic;
   determining whether the associated reliability statistic satisfies a threshold criterion; and
   responsive to determining that the associated reliability statistic does not satisfy the threshold criterion, determining the read margin associated with the first distribution of memory cells based on the modified read level.

6. The system of claim 5, wherein determining the read margin associated with the first distribution of memory cells of the identified memory die further comprising:
   responsive to determining that the associated reliability statistic does satisfy the threshold criterion, modifying the modified read level by the fixed voltage step size.

7. The system of claim 1, wherein the first distribution of memory cells of the identified memory die comprises an erase distribution representing a plurality of memory cells of the identified memory die in an erased state.

8. A method comprising:
   detecting an occurrence of a data integrity check trigger event in a memory sub-system;
   responsive to the occurrence of the data integrity check trigger event, identifying a memory die of a plurality of memory dies in the memory sub-system;
   determining a read margin associated with a first distribution of memory cells of the identified memory die, wherein the read margin represents an entire voltage range between the first distribution of memory cells and an adjacent distribution of memory cells for which an associated reliability statistic satisfies a threshold criterion; and determining an adaptive scan frequency for the identified memory die based on the read margin associated with the first distribution of memory cells, wherein determining the adaptive scan frequency for the identified memory die based on the read margin associated with the first distribution of memory cells comprises reading an entry of a plurality of entries in a data structure, the entry corresponding to the read margin associated with the first distribution of memory cells, wherein each entry of the plurality of entries is associated with a respective read margin, and wherein each entry comprises an indication of a respective scan frequency corresponding to the respective read margin.

9. The method of claim 8, further comprising:
determining respective adaptive scan frequencies for each of the plurality of memory dies.

10. The method of claim 8, further comprising:
determining that the adaptive scan frequency for the identified memory die has been reached;
performing a data integrity check to determine a reliability statistic for a segment of the identified memory die;
determining whether the reliability statistic satisfies a folding criterion; and responsive to determining that the reliability statistic satisfies the folding criterion,
performing a folding operation on the segment of the identified memory die.

11. The method of claim 8, wherein the data integrity check trigger event comprises at least one of a power-on of the memory sub-system, an expiration of a threshold period of time since a previous data integrity check, or an occurrence of a threshold number of program-erase cycles in the system since the previous data integrity check.

12. The method of claim 8, wherein determining the read margin associated with the first distribution of memory cells of the identified memory die comprises:
modifying a current read level by a fixed voltage step size;
performing a read operation using the modified read level to determine the associated reliability statistic;
determining whether the associated reliability statistic satisfies a threshold criterion; and
responsive to determining that the associated reliability statistic does not satisfy the threshold criterion, determining the read margin associated with the first distribution of memory cells based on the modified read level.

13. The method of claim 12, wherein determining the read margin associated with the first distribution of memory cells of the identified memory die further comprising:
responsive to determining that the associated reliability statistic does satisfy the threshold criterion, modifying the modified read level by the fixed voltage step size.

14. The method of claim 8, wherein the first distribution of memory cells of the identified memory die comprises an erase distribution representing a plurality of memory cells of the identified memory die in an erased state.

15. A non-transitory computer-readable storage medium comprising instructions that, when executed by a processing device, cause the processing device to perform operations comprising:
for each memory die of a plurality of memory dies in a memory sub-system, determining respective read margins associated with erase distributions of memory cells of each memory die, wherein the read margin represents an entire voltage range between the erase distributions of memory cells and an adjacent distribution of memory cells for which an associated reliability statistic satisfies a threshold criterion;
determining respective adaptive scan frequencies for the plurality of memory dies based on the respective read margins associated with the erase distributions of memory cells, wherein determining the respective adaptive scan frequencies for the plurality of memory dies based on the respective read margins associated with the erase distributions of memory cells comprises reading respective entries of a plurality of entries in a data structure, the respective entries corresponding to the respective read margins associated with the erase distributions of memory cells, wherein each entry of the plurality of entries is associated with a respective read margin, and wherein each entry comprises an indication of a respective scan frequency corresponding to the respective read margin; and
performing data integrity checks on the plurality of memory dies according to the respective adaptive scan frequencies.

16. The non-transitory computer-readable storage medium of claim 15, further comprising: determining that the respective adaptive scan frequency for a given memory die of the
plurality of memory dies has been reached;
performing a data integrity check to determine a reliability statistic for a segment of the given memory die;
determining whether the reliability statistic satisfies a folding criterion; and
responsive to determining that the reliability statistic satisfies the folding criterion, performing a folding operation on the segment of the given memory die.

17. The non-transitory computer-readable storage medium of claim 15, wherein determining the respective read margins associated with the erase distributions of memory cells die comprises:
modifying a current read level by a fixed voltage step size;
performing a read operation using the modified read level to determine the associated reliability statistic;
determining whether the associated reliability statistic satisfies a threshold criterion; and
responsive to determining that the associated reliability statistic does not satisfy the threshold criterion, determining the read margin based on the modified read level.

* * * * *